United States Patent [19]

Takimoto et al.

[11] Patent Number: 4,661,140
[45] Date of Patent: Apr. 28, 1987

[54] GAS REACTION APPARATUS AND MULTI-WALL PIPE TYPE BURNER THEREFOR

[75] Inventors: Hiroaki Takimoto; Ichiro Tsuchiya, both of Yokohama, Japan

[73] Assignee: Sumitomo Electric Industries, Ltd., Osaka, Japan

[21] Appl. No.: 826,209

[22] Filed: Feb. 5, 1986

[30] Foreign Application Priority Data

Feb. 6, 1985 [JP] Japan ............................ 60-14629[U]
Feb. 18, 1985 [JP] Japan .................................. 60-28425

[51] Int. Cl.⁴ ...................... C03C 25/02; C03B 37/027
[52] U.S. Cl. ...................................... 65/157; 65/3.12; 65/18.2
[58] Field of Search ...................... 65/1, 2, 3.11, 3.12, 65/18.2, 157

[56] References Cited

FOREIGN PATENT DOCUMENTS

2092738 8/1982 United Kingdom ..................... 65/1

Primary Examiner—Robert Lindsay
Attorney, Agent, or Firm—Cushman, Darby & Cushman

[57] ABSTRACT

A gas reaction apparatus for manufacturing base material of optical fiber and a multi-wall pipe type burner for the gas reaction apparatus. The gas reaction apparatus includes a mechanism which heats or heat insulates at least one of gas passages of the burner for gaseous raw material of optical fiber so as to set a saturated vapor pressure of whole kinds of the gaseous raw material higher than a partial pressure of raw material of optical fiber in the gaseous raw material when the gaseous raw material is fed through the one of the gas passages.

24 Claims, 10 Drawing Figures

GAS REACTION APPARATUS AND MULTI-WALL PIPE TYPE BURNER THEREFOR

BACKGROUND OF THE INVENTION

The present invention generally relates to reaction apparatuses and more particularly, to a gas reaction apparatus for manufacturing base material of optical fiber and a multi-wall pipe type burner for use in the gas reaction apparatus.

Figure 1A:
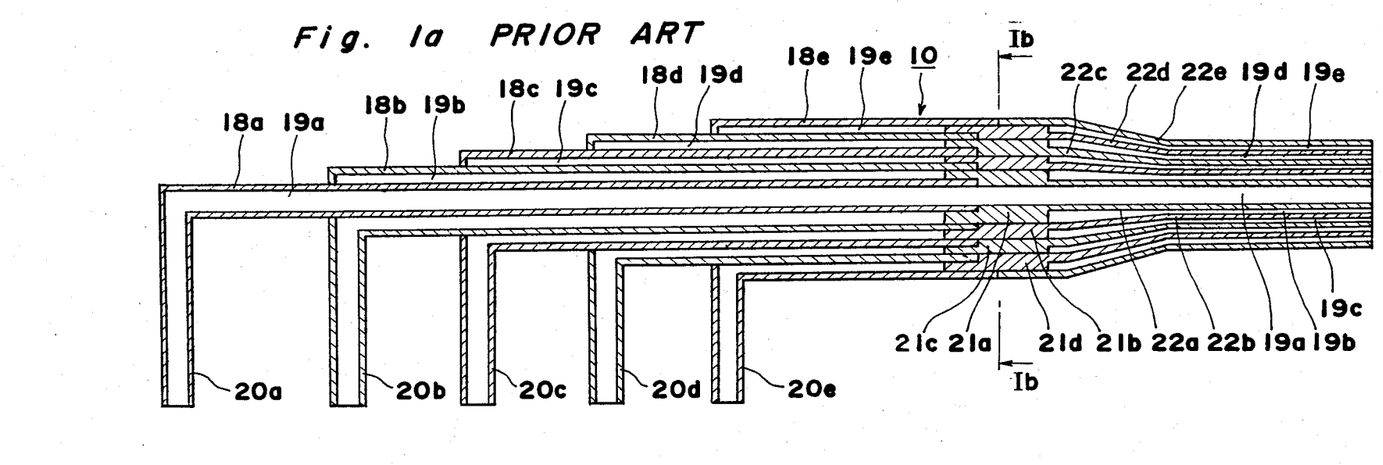
FIG. 1a is a longitudinal sectional view of a prior art multi-wall pipe type burner (already referred to)
Figure 1B:
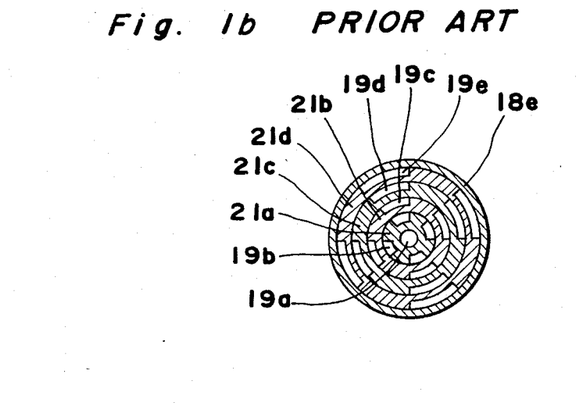
FIG. 1b is a cross-sectional view taken along the line Ib—Ib in FIG. 1a (already referred to)

In order to manufacture base material of optical fiber by employing VAD method, such a multi-wall pipe type burner as shown in FIGS. 1a and 1b is widely used. The known burner includes a body 10. The body 10 is composed of a plurality of coaxially extending metallic cylindrical pipes 18a, 18b, 18c, 18d and 18e, spacers 21a, 21b, 21c and 21d for supporting the pipes 18a to 18d, respectively and heat-resistant metallic cylindrical pipes 22a, 22b, 22c, 22d and 22e constituting forward end portions of the pipes 18a to 18e, respectively. The pipes 18a to 18e are, respectively, coupled with the pipes 22a to 22e through the spacers 21a to 21d. Gas passages 19a, 19b, 19c, 19d and 19e for combustion gas of the burner, vaporous gaseous raw material formed into glass, inert gas, etc. are defined by a bore in the central pipe 18a and gaps formed between adjacent ones of the peripheral pipes 18b to 18e, respectively. The gas passages 19a to 19e are, respectively, communicated, at rearward end portions of the pipes 18a to 18e, with pipes 20a, 20b, 20c, 20d and 20e leading to respective gas supply sources.

Conventionally, in a gas reaction apparatus for manufacturing base material of optical fiber, it has been generally so arranged so that such one or more multi-wall pipe type burners as shown in FIGS. 1a and 1b are provided and gaseous raw material of optical fiber, combustion gas, inert gas, etc. are supplied into the gas passages 19a to 19e of each of the burners. Thus, the gaseous raw material is heated to a high temperature by combustion of the combustion gas at the forward end portions of the burners so as to be subjected to flame hydrolysis into glass of fine particles. The glass of fine particles is deposited on a member so as to be formed into porous base material of optical fiber.

In the manufacture of such base material of optical fiber, uniformity of material characteristics of the base material of optcial fiber in the longitudinal direction of the base material plays an extremely important role for obtaining characteristics of optical fiber. In order to obtain optical fiber having uniform material characteristics in its longitudinal direction, it is necessary to minimize variations of concentration and flow rate of the gaseous raw material introduced into the gas reaction apparatus.

Figure 2:
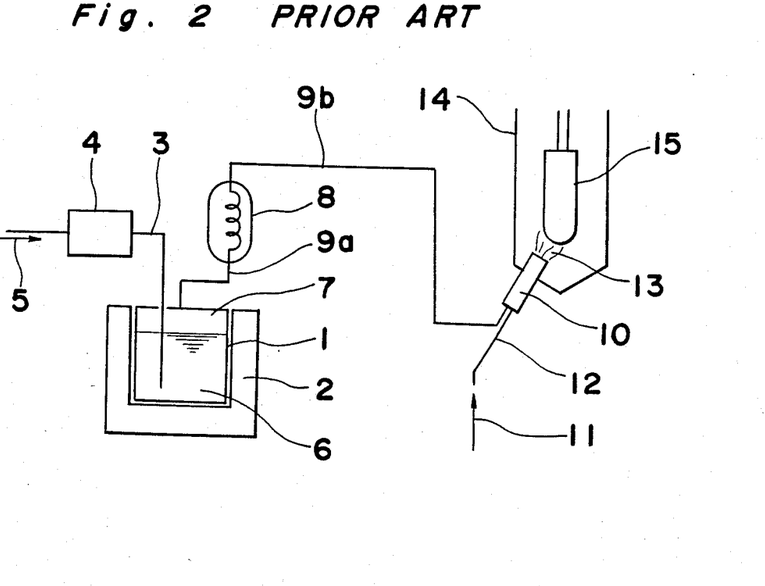
FIG. 2 is a schematic view of a prior art gas reaction apparatus (alread referred to)

In order to meet such demand, for example, two gas reaction apparatuses shown in FIGS. 2 and 3, respectively have been used. In the prior art gas reaction apparatus of FIG. 2, flow control of carrier gas 5 is performed and a condenser 8 is employed. Namely, the carrier gas 5 is supplied at a predetermined flow rate via a pipe 3, through a flow control device 4, into a raw material vessel 1 containing liquid raw material 6 of optical fiber, which is enclosed by a constant temperature bath 2. Gaseous raw material of optical fiber heated to a temperature of the constant temperature bath 2 by the constant temperature bath 2 is carried via a pipe 9a together with the carrier gas 5 from an upper space 7 of the raw material vessel 1 to a condenser 8 held at a predetermined temperature. The gaseous raw material is cooled to the predetermined temperature of the condenser 8 by the condenser 8 so as to be formed into saturated vapor. Then, the saturated vapor of the gaseous raw material is conveyed via a pipe 9b to the multi-wall pipe type burner 10 shown in FIGS. 1a and 1b, which is provided in a reaction vessel 14. At this time, since condensation of the gaseous raw material takes place if the temperature of the pipes 9a and 9b is lower than that of the saturated vapor, the pipes 9a and 9b are heat insulated or heated. Meanwhile, gases 11 other than the gaseous raw material, such as combustion gas, etc. are supplied via a pipe 12, etc. to the burner 10. Thus, reaction of the gaseous raw material is caused by heat of combustion of the combustion gas at the forward end portion of the burner 10 so as to form the gaseous raw material into glass powder such that the glass powder is grown into longitudinally extending porous base material 15 of optical fiber.

Figure 3:
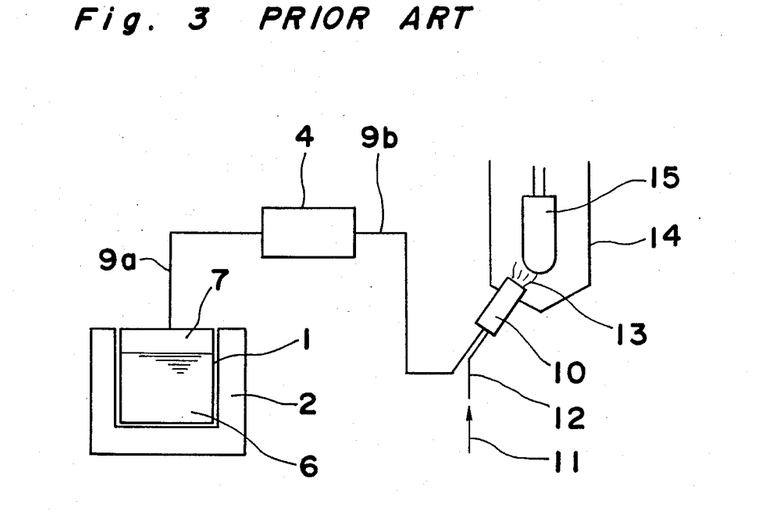
FIG. 3 is a schematic view of another prior art gas reacton apparatus (already referred to)

Meanwhile, in the prior art gas reaction apparatus of FIG. 3, flow control of vapor of the liquid raw material 6 is performed. Namely, the raw material vessel containing the liquid raw material 6 is enclosed by the constant temperature bath 2. Vapor of the liquid raw material 6 which has a predetermined temperature, is supplied, as gaseous raw material of optical fiber, from the upper space 7 of the raw material vessel 1 to the multi-wall pipe tye burner 10 of the reaction vessel 14 via the pipe 9a, the flow control device 4 and the pipe 9b. Flow rate of the gaseous raw material is controlled by the flow control device 4. Meanwhile, the gases 11 other than the gaseous raw material, such as the combustion gas, etc. are supplied via the pipe 12, etc. to the burner 10 shown in FIGS. 1a and 1b. Thus, reaction of the gaseous raw material is caused by heat of combustion of the combustion gas at the forward end portion of the burner 10 so as to form the gaseous raw material into glass powder such that the glass powder is grown into the longitudinally extending porous base material 15 of optical fiber. In FIGS. 2 and 3, reference numeral 13 represents flame of the burner 10.

In the prior art gas reaction apparatuses for optical fiber shown in FIGS. 2 and 3, the gaseous raw material in vapor phase is introduced into at least one gas passage such as one of those of the burner 10. At the same time, the gases 11 such as the combustion gas, etc. are introduced into the same gas passage as that for the gaseous raw material or other gas passages than that for the gaseous raw material. However, since the gases 11 such as the combustion gas, etc. are supplied from bombs exposed to atmosphere, a case may occur in which temperatures of the gases 11 are far lower than that of the gaseous raw material. In this case, the gaseous raw material is directly cooled by the cold gases 11 when the gases 11 are introduced into the same gas passage as that for the gaseous raw material. Meanwhile, when the gases 11 are introduced into other gas passges than that for the gaseous raw material, the gaseous raw material is indirectlly cooled by the coled gases 11 through the walls separating the gas passage for the gaseous raw material from the gas passages for the gases 11. Therefore, as a result of drop of temperature of the gaseous raw material, the gaseous raw material is partially liquified and thus, amount of the gaseous raw material fed into the reaction vessel 14 decreases. Thus, the prior art gas reaction apparatuses are disadvantageous in that it becomes impossible to obtain a desired amount of the base material 15 of optical fiber. In addition, the prior art gas reaction apparatuses have such a serious drawback that temperatures of the gases 11 such as the combustion as, etc. are affected by variations in temperature of atmosphere, thereby resulting in non-uniformity of material characteristics of the base material 15 of optical fiber in the longitudinal direction of the base material 15.

In order to prevent liquefaction of the gaseous raw material, there has been conventionally employed a method in which a heater is provided around the burner 10. However, in this known method, in the case where the gaseous raw material is passed through a radially inner one or ones of the gas passages of the multi-wall pipe type burner 10, it becomes impossible to sufficiently prevent liquefaction of the gaseous raw material due to rise of concentration of the gaseous raw material in the prior art gas reaction apparatus of FIG. 3 and recent increase of the number of the gas passages of the multi-wall pipe type burner 10, e.g., from four to eighteen.

SUMMARY OF THE INVENTION

Accordingly, an essential object of the present invention is to provide a gas reaction apparatus in which condensation of gaseous raw material does not take place in a multi-wall pipe type burner provided in a reaction vessel such that base material of optical fiber, which has uniform material characacteristics in a longitudinal direction of the base material, can be obtained, with substantial elimination of the disadvantages inherent in conventional apparatuses of this kind.

Another important object of the present invention is to provide a multi-wall pipe type burner employed in the gas reaction apparatus of the above described type.

In order to accomplish these objects of the present invention, there is provided a mechanism in which a gas passage for feeding the gaseous raw material therethrough is heated or heat insulated such that the gaseous raw material is maintained at such a temperature as to set a saturated vapor pressure of whole kinds of the gaseous raw material higher than a partial pressure of raw material of optical fiber in the whole kinds of the gaseous raw material even in the case where the gaseous raw material is fed through the gas passage.

This mechanism can be obtained by employing one or both of the following first and second arrangements.

In the first arrangement, there is provided a heater for maintaining gases other than the gaseous raw material at such a temperature as to set a saturated vapor pressure of whole kinds of the gaseous raw material introduced into the reaction vessel, higher than a partial pressure of the raw material of optical fiber in the gaseous raw material.

Meanwhile, in the second arrangement, there is provided a heating means for directly heating the gas passage for feeding the gaseous raw material therethrough. More specifically, there is provided a multi-wall pipe type burner according to one embodiment of the present invention comprising a plurality of electrically conductive cylinrical pipes; a plurality of electrically conductive spacers for supporting, at forward end portions of the pipes, the pipes coaxially; a plurality of electrical insulating members; the pipes being supported, at rearward end portions thereof, through the electrical insulating members; and an electrode for supplying electric power to a predetermined one of the pipes so as to heat the predetermined one of the pipes, which is provided at a rearward end of the predetermined one of the pipes.

In a multi-wall pipe type burner according to another embodiment of the present invention, there is provided a sheathed heater extending up to a location adjacent to a forward end of a specific one of the gas passages.

BRIEF DESCRIPTION OF THE DRAWINGS

These objects and features of the present invention will become apparent from the following description taken in conjunction with the preferred embodiments thereof with reference to the accompanying drawings, in which:

FIG. 6b is a cross-sectional view taken along the line VIb—VIb in FIG. 6a;

FIG. 7b is a cross-sectional view taken aong the line VIIb—VIIb in FIG. 7a.

Before the description of the present invention proceeds, it is to be noted that like parts are designated by like reference numerals throughout several view of the accompanying drawings.

DETAILED DESCRIPTION OF THE INVENTION

Figure 4:
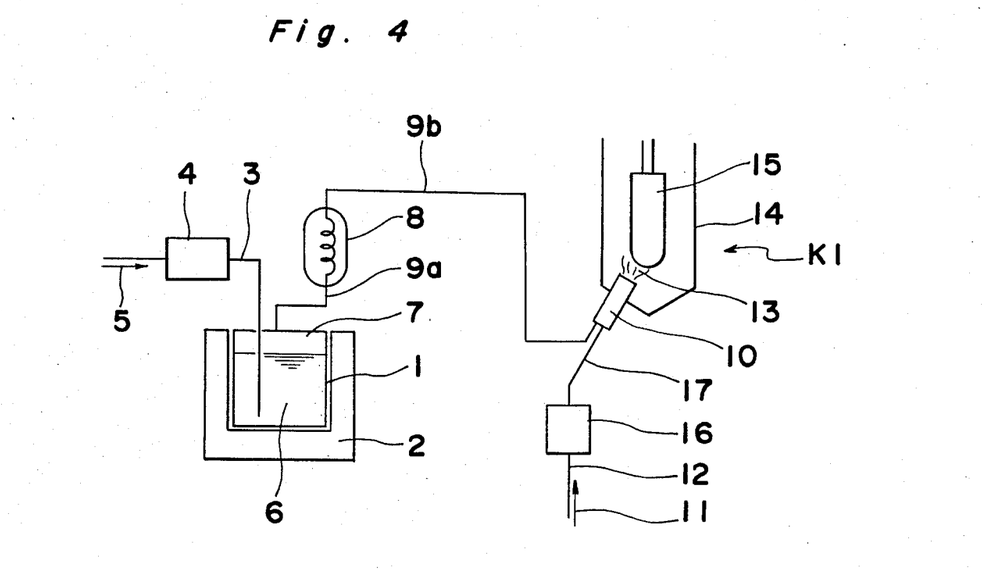
FIG. 4 is a schematic view of a gas reaction apparatus according to a first embodiment of the present invention.

Referring now to the drawings, there is shown in FIG. 4, a gas reaction apparatus K1 for manufacturing base material 15 of optical fiber, according to a first embodiment of the present invention. The gas reaction apparatus K1 embodies improvements on the prior art gas reaction apparatus of FIG. 2, in which flow control of carrier gas is performed and a condenser is employed. Namely, in the gase reaction apparatus K1, carrier gas 5 is supplied, at a predetermined flow rate set by a flow control device 4, via a pipe 3 into a raw material vessel 1 containing liquid raw material 6 of optical fiber, which is enclosed by a constant tempeature bath 2. The liquid raw material 6 includes $SiCl_4$, $GeCl_4$, etc. held in liquid state at room temperature. When carrier gas 5 is introduced into the liquid raw material 6 via the pie 3, the liquid raw material 6 is bubbled into gaseous raw material of optical fiber. A gaseous mixture of the carrier gas 5 and the gaseous raw material is stored in an upper space 7 of the raw material vessel 1 so as to be fed via a pipe 9a to a condenser 8 held at a predetermined temperature such that the gaseous raw material in vapor phase is supplied via a pipe 9b to a multi-wall pipe type burner, for example, the known multi-wall pipe type burner 10 shown in FIGS. 1a and 1b. The pipe 9b extending between the condenser 8 and the burner 10 is heated and/or partially heat insulated so as to be maintained at a temperature above that of the condenser 8.

Furthermore, in the gas reaction apparatus K1, gases 11 other than the gaseous raw material, such as combustion gas, sealing gas, etc. are fed to a heating apparatus 16 via a pipe 12 so as to be heated to a predetermined temperature by the heating apparatus 16. Then, the gases 11 heated to the predetermined temperature by the heating apparatus 16 are introduced via pipes 17 into coaxial gas passages of the burner 10, i.e., the same gas passage as that for the gaseous raw material or other gas passages than that for the gaseous raw material. Needless to say, the pipes 17 are heated to a required temperature or heat insulated such that the gases 11 are prevented from being cooled after being conveyed out of the heating apparatus 16.

In the gas reaction apparatus K1, the gases 11 other than the gaseous raw material are suppoled to the burner 10 after having been heated by the heating apparatus 16 to such a predetermined temperature as to set a sauturated vapor pressure of whole kinds of the gaseous raw material higher than a partial pressure of raw material of optical fiber in the whole kinds of the gaseous raw material. Accordingly, in the gas reaction apparatus K1, since such a phenomenon associated with the known gas reaction apparatus of FIG. 2 does not take place with the gases 11 other than the gaseous raw material, which have been cooled by atmosphere, are directly supplied to the burner 10, such an inconvenience is obviated that the gas passages of the burner 10 are cooled by atmosphere due to drop of temperature of atmosphere such that the gaseous raw material is condensed in the burner 10, thereby resulting in variations of amount of the base material 15 of optical fiber. Namely, in the gas reaction apparatus K1, since the gases 11 other than the gaseous raw material are heated by the heating apparatus 16 to such a temperature as to set the saturated vapor pressure of the whole kinds of the gaseous raw material higher than the partial pressure of the raw material of optical fiber in the whole kinds of the gaseous raw material, condensation of the gaseous raw material does not take place in the burner 10 and thus, the gaseous raw material having a predetermined concentration can be supplied to a reaction vessel 14. Therefore, chemical reaction of the gaseous raw material fed to the burner 10 at a predetermined flow rate and having the predetermined concentration takes place in flame 13 of the burner 10 so as to form the gaseous raw material into glass powder such that the glass powder is stably grown into longitudinally extending porous base material 15 of optical fiber, which has predetermined material characteristics.

Figure 5:
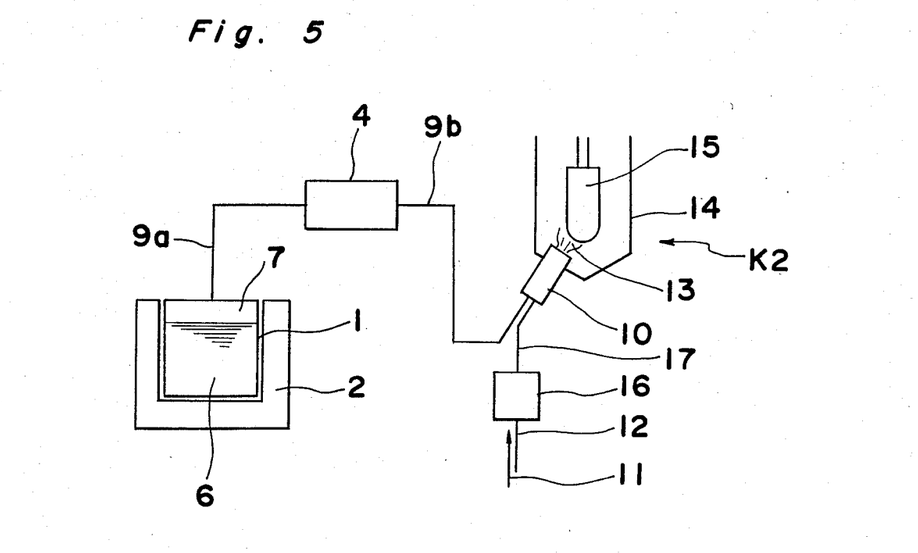
FIG. 5 is a view similar to FIG. 4, particularly showing a second embodiment of the present invention.

Referring to FIG. 5, there is shown a gas reaction apparatus K2 according to a second embodiment of the present invention. The gas reaction apparatus K2 embodies improvements on the prior art gas reaction apparatus of FIG. 3, in which flow control of vapor of liquid raw material is performed. Namely, in the gas reaction apparatus K2, the raw material vessel 1 containing the liquid raw material 6 is enclosed by the constant temperature bath 2. Vapor of the liquid raw material 6, which has been heated to a predetermined temperature, is filled in the upper space 7 of the raw material vessel 1 and is supplied, as gaseous raw material, to the burner 10 vai the pipe 9a, the flow control device 4 and the pipe 9b. The liquid raw material 6 is heated so as to be vaporized into the gaseous raw material having a pressure higher than atmospheric pressure such that the gaseous raw material is fed into the burner 10 by the pressure of the gaseous raw material. Meanwhile, the pipes 9a and 9b are heated and/or partially heat insulated such that the gaseous raw material in the pipes 9a and 9b is prevented from being condensed.

Furthermore, in the gas reaction apparatus K2, the gases 11 other than the gaseous raw material are fed to the heating apparatus 16 by way of the pipe 12 so as to be heated to a predetermined temperature by the heating apparatus 16. Subsequently, the gases 11 heated to the predetermined temperature by the heating apparatus 16 are supplied to the burner 10 through the pipe 17. In the gas reaction apparatus K2, since the gases 11 other than the gaseous raw material are heated by the heating apparatus 16 to such a temperature as to set a saturated vapor pressure of whole kinds of the gaseous raw material introduced into the burner 10, higher than a partial pressure of raw material of optical fiber in the whole kinds of the gaseous raw material, condensation of the gaseous raw material due to cooling of the gaseous raw material does not take place in the burner 10. Accordingly, the gaseous raw material is accurately fed to the burner 10 at a flow rate adjusted by the flow control device 4 and enters into reaction in the flame 13 of the burner 10 so as to be formed into glass powder such that the glass powder is stably grown into the longitudinally extending porous base material 15 of optical fiber, which has predetermined material characteristics.

Meanwhile, in the gas reaction apparatuses K1 (FIG. 4) and K2 (FIG. 5), the single burner 10 is provided in the reaction vessel 14. However, it can also be so arranged in the gas reaction apparatuses K1 and K2 that a plurality of the burners 10 for effecting reaction of the same gaseous raw material or different kinds of gaseous raw materials are provided in the reaction vessel 14. In this case, the gases 11 other than the gaseous raw material are heated by the single heating apparatus 16 to such temperatures as to set saturated vapor pressures of the various gaseous raw materials supplied to the corresponding burners 10, higher than partial pressures of raw materials of optical fiber in the various gaseous raw materials, respectively. Needless to say, it can also be so arranged that a plurality of the heating apparatuses 16 are provided for the respective burners 10 so as to heat the gases 11 to such temperatures as to set saturated vapor pressures of the various gaseous raw materials higher than partial pressures of gaseous raw materials of optical fiber in the various raw materials, respectively.

Figure 6A:
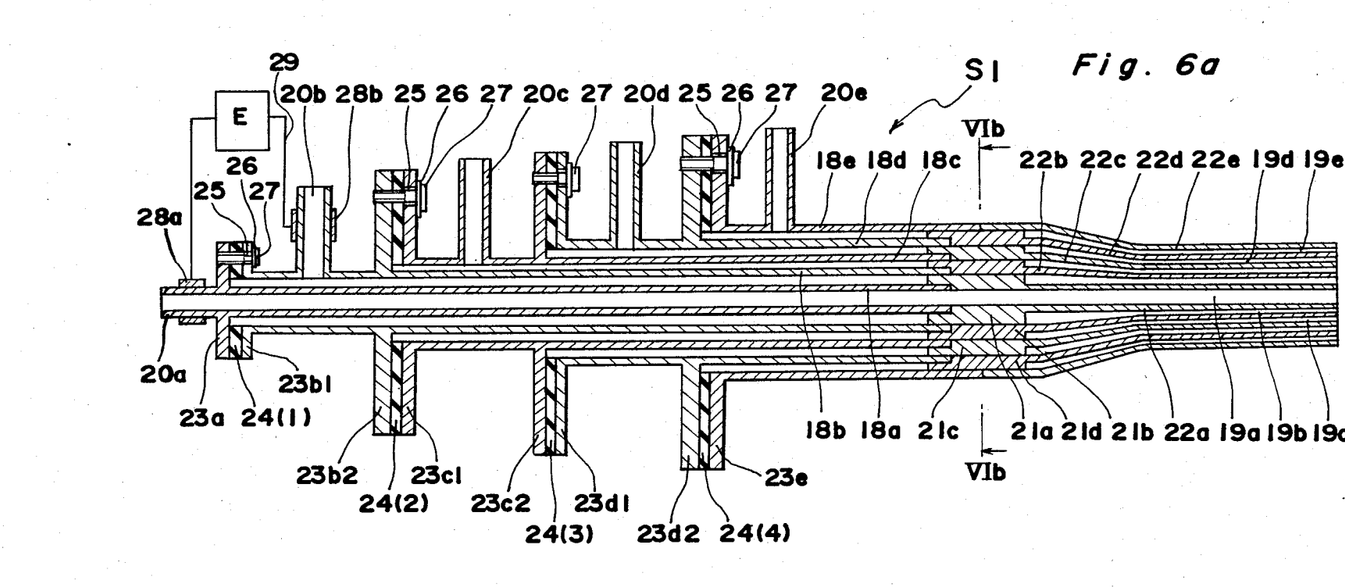
FIG. 6a is a longitudinal sectional view of a multi-wall pipe type burner according to one embodiment of the present invention.
Figure 6B:
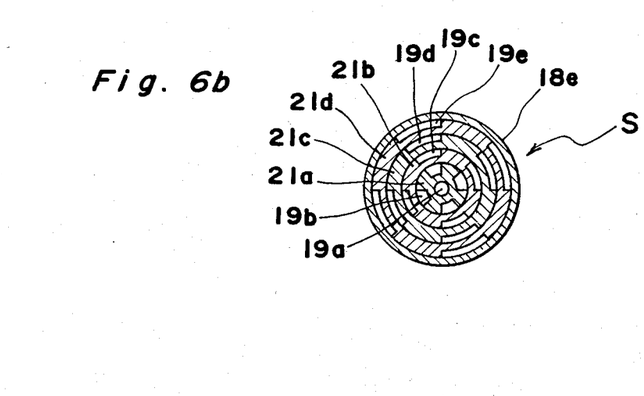

Referring further to FIGS. 6a and 6b, there is shown a multi-wall pipe type burner S1 employed in the gas reactin apparatus, according to one embodiment of the present invention. The multi-wall pipe type burner 10 includes a plurality of cylindrical pipes 18a, 18b, 18c, 18d and 18e which are made of electrically conductive material such as metal. The pipes 18a to 18e are supported coaxially with each other by electrically conductive spacers 21a, 21b, 21c and 21d and are, respectivele, coupled, through the spacers 21a to 21d, with heat-resistant cylindrical pipes 22a, 22b, 22c, 22d and 22e constituting forward end portions of the pipes 18a to 18e, respectively.

Furthermore, a flange 23a is provided at a rearward end portion of the pipe 18a, while flanges 23b1 and 23b2 are provided at rearward end portions of the pipe 18b. Likewise, flanges 23c1 and 23c2 are provided at rearward end portions of thep ipe 18c, while flanges 23d1 and 23d2 are provided at rearward end portions of the pipe 18d. Meanwhile, a flange 23e is provided at a rearward end portion of the pipe 18e. Electrical insulating plates 24(1), 24(2), 24(3) and 24(4) are, respectively, interposed between the opposed flanges 23a and 23b1, between the opposed flanges 23b2 and 23c1, between the opposed flanges 23c2 and 23d1 and between the opposed flanges 23d2 and 23e. Each pair of the flanges 23a and 23b1, the flanges 23b2 and 23c1, the flanges 23c2 and 23d1 and the flanges 23d2 and 23e are secured to each other by a screw 27 through an electrical insulating collar 25 and an electrical insulating washer 26 so as to be electrically insulated from each other. Meanwhile, in the case where some of the pipes 18a to 18e are not required to be heated, it can also be so arranged that said some of the pipes 18a to 18e are not electrically insulated.

Meanwhile, the pipes 18a to 18e are, respectively, coupled, at their rearward end portions, with pipes 20a, 20b, 20c, 20d and 20e leading to supply sources of gases such as the gaseous raw material, combustion gas, inert gas, etc. Gas passages 19a, 19b, 19c, 19d and 19e are defined by a bore in the central pipe 18a and gaps formed between adjacent ones of the peripheral pipes 18b to 18e, respectively. Gas passages for feeding the gaseous raw material, combustion gas and inert gas therethrough, respectively are selected from the gas passages 19a to 19e in accordance with the design requirements. Supposing that the gaseous raw material having a saturated vapor pressure and the combustion gas are fed through the gas passages 19a and 19b, respectively in the burner S1, the cooled combustion gas is supplied into the gas passage 19b so as to cool the wall of the pipe 18a. When the saturated vapor pressure of the gaseous raw material becomes lower than a partial pressure of raw material of optical fiber in the gaseous raw material, condensation of the gaseous raw material takes place. Thus, electrodes 28a and 28b are attached to the pipes 20a and 20b, respectively and are coupled with each by a lead wire 29 via a power source E. Electric power is supplied from the power source E to the pipes 18a and 18b so as to heat the pipes 18a and 18b. The pipe 18a is required to be heated by the power source E so as to be at least maintained at such a temperature as to set the saturated vapor pressure of the gaseous raw material higher than the partial pressure of the raw material of optical fiber in the gaseous raw material. Meanwhile, electric power from the power source E is not supplied to the pipes 22a to 22e. Namely, since the pipes 22a to 22e disposed at the forward end of the burner S1 are maintained at high temperatures by the flame of the burner S1, the pipes 22a to 22e are not required to be heated.

In FIG. 6a, electric power is supplied to the pipes 18a and 18b by way of example. In the case where the gaseous raw material is supplied into the neighboring gas passages and the temperature of the saturated vapor of the gaseous raw material in one gas passage is different from that of the saturated vapor of the gaseous raw material in another gas passage, pipes defining walls of the neighboring gas passages are required to be heated so as to be at least maintained at such a temperature as to set the saturated vapor pressure of whole kinds of the gaseous raw material in the neighboring gas passages higher than the partial pressure of the raw material of optical fiber in the whole kinds of the gaseous raw material.

Figure 7A:
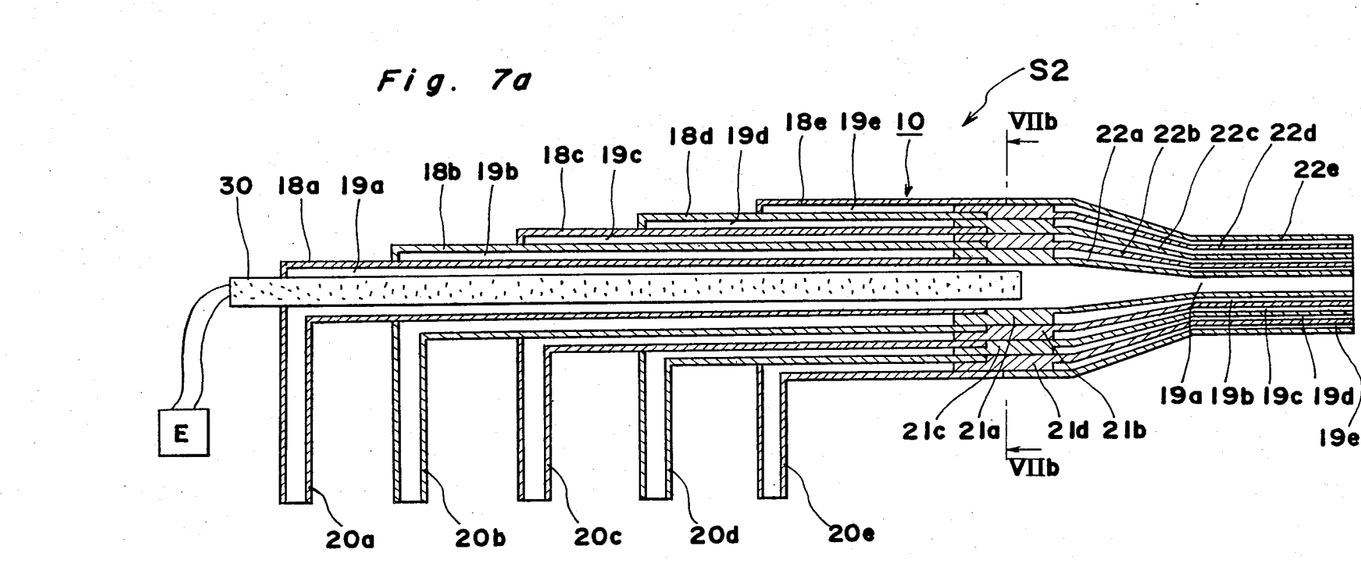
FIG. 7a is a view similar to FIG. 6a, particularly showing another embodiment of the present invention.
Figure 7B:
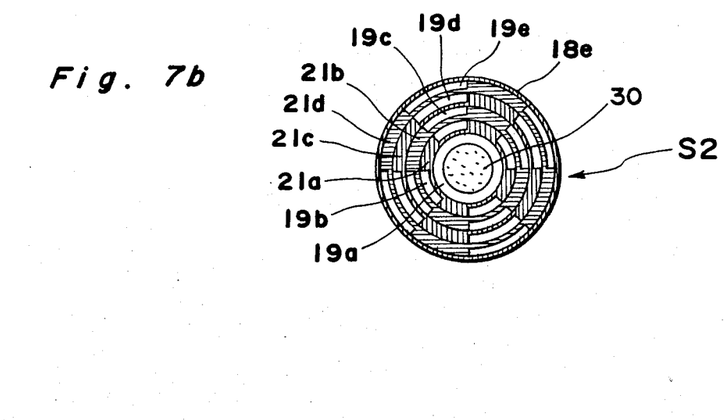

Referring finally to FIGS. 7a and 7b, there is shown a multi-wall pipe type burner S2 according to another embodiment of the present invention. In the case where the gaseous raw material is supplied into a single gas passage of the burner, the burner S2 can be used more easily than the burner S1. The burner S2 includes a body 10. The body 10 includes a plurality of the cylindrical metallic pipes 18a to 18e provided coaxially with each other, the spacers 21a to 21d for supporting the pipes 18a to 18e and the cylindrical metallic pipes 22a to 22e having a high melting point and constituting a forward end portion of the burner S2. The pipes 18a to 18e are, respectively, coupled with the pipes 22a to 22e through the spacers 21a to 21d. The gas passages 19a to 19e for combustion gas of the burner S2, the gaseous raw material in vapor phase, inert gas, etc. are defined by the bore in the central pipe 18a and gaps formed between adjacent ones of the peripheral pipes 18b to 18e, respectively. The gas passages 19a to 19e are, respectively, communicated, at rearward end portions of the pipes 18a to 18e, with the pipes 20a to 20e leading to respective gas supply sources.

In the burner S2, a sheathed heater 30 is inserted into the gas passage 19a up to a location adjacent to the forward end of the gas passage 19a so as to project out of the rearward end of the gas passage 19a. The power source E is connected to the rearward end of the sheathed heater 30. In the burner S2, the gaseous raw material is fed through the gas passage 19a, while the combustion gas, inert gas, etc. are fed through the gas passages 19b to 19e. In FIG. 7, the combustion gas is fed through the gas passage 19b. Since the pipe 18a is cooled, the sheaqthed heater 30 is maintained at a temperature higher by 10° C. or more than such a temperature as to set the saturated vapor pressure of the gaseous raw material flowing through the gas passage 19a higher than the partial pressure of the raw material of optical fiber in the gaseous raw material. In the burner S2, the pipes 22a and 22e disposed at the forward end portion of the burner S2 are not specifically heated. Namely, since the forward end portion of the burner S2 is maintained at high temperatures by the flame of the burner S2, the pipes 22a to 22e are not required to be heated. When the gaseous raw material is fed through a gas passage other than the gas passage 19a, the sheathed heater 30 is embedded in said gas passage.

In accordance with the present invention, such an inconvenience can be obviated that the partial pressure of the raw material of optical fiber in the gaseous raw material becomes higher than the saturated vapor pressure of the gaseous raw material so as to be condensed in the multi-wall pipe type burner of the gas reaction apparatus. Consequently, the porous base material of optical fiber can be formed in the reaction vessel uniformly in the longitudinal direction of the base material and thus, optical fibers having excellent qualities can be obtained.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. In a gas reaction apparatus in which apparatus at least one gaseous raw material of optical fiber and at least one kind of gas different from said gaseous raw material and from a mixture including said gaseous raw material, which gas includes combustion gas, are introduced into a reaction vessel from at least one multi-wall pipe type burner which burner has a plurality of gas passages whereby said gaseous raw material is subjected to flame hydrolysis into powdery glass which powdery glass is deposited on a rod member whereby said powdery glass is formed into porous base material of optical fiber, the improvement comprising:

a means for heating or heat insulating at least one of said gas passages for said gaseous raw material or said mixture at a temperature so that a saturated vapor pressure of whole kinds of said gaseous raw material is set higher than a partial pressure of raw material of optical fiber in said gaseous raw material or said mixture when said gaseous raw material or said mixture is fed through said heated or heat insulated gas passages.

2. A gas reaction apparatus as claimed in claim 1, wherein said means comprises a heating apparatus capable of maintaining a temperature of said gas introduced into said burner so that a saturated vapor pressure of whole kinds of said gaseous raw material introduced into said reaction vessel is set higher than a partial pressure of said raw material of optical fiber in said gaseous raw material or said mixture.

3. A gas reaction apparatus as claimed in claim 1, wherein said gas is fed through at least one of said gas passages which gas passage abuts said gas passages for said gaseous raw material or said mixture and said means comprises a heating apparatus capable of maintaining a temperature of said gas so that a saturated vapor pressure of said gaseous raw material is set higher than a partial pressure of said raw material of optical fiber in said gaseous raw material or said mixture.

4. A gas reaction apparatus as claimed in claim 1, which includes a plurality of said burners, said gas being maintained in eaqch of said burners at a temperature so that a saturated vapor pressure of whole kinds of said gaseous raw material introduced into each of said burners is set higher than a partial pressure of said raw material of optical fiber in said gaseous raw material or said mixture.

5. A gas reaction apparatus as claimed in claim 4, wherein said gas is fed in each of said burners through at least one of said gas passages which gas passage abuts said gas passages for said gaseous raw material or said mixture and said means comprises a heating apparatus capable of maintaining in each of said burners said gas at such a temperature as to set a saturated vapor pressure of said gaseous raw material higher than a partial pressure of said raw material of optical fiber in said gaseous raw material of said mixture.

6. A multi-wall pipe type burner for use in a gas reaction apparatus in which burner at least one gaseous raw material of optical fiber and at least one kind of gas different from said gaseous raw material and from a mixture including said gaseous raw material, which gas includes combustion gas, are introduced into a reaction vessel from said burner which burner has a plurality of gas passages whereby said gaseous raw material is subjected to flame hydrolysis into powdery glass which powdery glass is deposited on a rod member whereby said powdery glass is formed into porous base material of optical fiber, said burner comprising:

a means for directly heating at least one of said gas passages for said gaseous raw material or said mixture.

7. A burner as claimed in claim 6, further comprising:
(a) a plurality of electrically conductive cylindrical pipes;
(b) a pluraltiy of electrically conductive spacers for supporting, at forward end portions of said pipes, said pipes coaxially so that said pipes include a central pipe and peripheral pipes, a bore of said central pipe and gaps between adjacent peripheral pipes forming gas passages;
(c) a plurality of electrical insulating members which electrical insulating members support said pipes at rearward end portions thereof;
(d) said means for heating comprising an electrode which electrode supplies electric power to said pipe to be heated, said electrode being provided at a rearward end of said pipe to be heated.

8. A burner as claimed in claim 6, wherein said means for heating includes a sheathed heater extending into said gas passages to be heated up to a location adjacent to a forward end of said gas passages to be heated.

9. A gas reaction apparatus as claimed in claim 1, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

10. A gas reaction apparatus as claimed in claim 2, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

11. A gas reaction apparatus as claimed in claim 3, wherein said gaseous raw material is obtained by evaporating liquid raw material of optical fiber by bubbling said liquid raw material using carrier gas so that said liquid raw material is introduced into said burner, said liquid raw material including and $SiCl_4$ and $GeCl_4$ held in liquid state at room temperature.

12. A gas reaction apparatus as claimed in claim 4, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

13. A gas reaction apparatus as claimed in claim 5, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

14. A burner as claimed in claim 6, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

15. A burner as claimed in claim 7, wherein said gaseous raw material is obtained by evaporating liquid raw material of optical fiber by bubbling said liquid raw material using carrier gas so that said raw material is introduced into said burner, said liquid raw material including $SiCl_4$ and $GeCl_4$ held in liquid state at room temperature.

16. A burner as claimed in claim 8, wherein said gaseous raw material is obtained by evaporating liquid raw material of optical fiber by bubbling said liquid raw material using carrier gas so that said liquid raw material is introduced into said burner, said liquid raw material including $SiCl_4$ and $GeCl_4$ held in liquid state at room temperature.

17. A gas reaction apparatus as claimed in claim 1, wherein said gaseous raw material is obtained by evaporating liquid raw material of optical fiber by heating said liquid raw material so that a pressure of gaseous raw material is higher than atmospheric pressure, said gaseous raw material being introduced into said burner by said pressure, said liquid raw material including $SiCl_4$ and $GeCl_4$ held in liquid state at room temperature.

18. A gas reaction apparatus as claimed in claim 2, wherein said gaseous raw material is obtained by evaporating liquid raw material of optical fiber by heating said liquid raw material so that a pressure of said gaseous raw material is higher than atmospheric pressure, said gaseous raw material being introduced into said burner by said pressure, said liquid raw material including $SiCl_4$ and $GeCl_4$ held in liquid state at room temperature.

19. A gas reaction apparatus as claimed in claim 3, wherein said gaseous raw material is obtained by evaporating liquid raw material of optical fiber by heating said liquid raw material so that a pressure of said gaseous raw material is higher than atmospheric pressure, said gaseous raw material being introduced into said burner by said pressure, said liquid raw material including $SiCl_4$ and $GeCl_4$ held in liquid state at room temperature.

20. A gas reaction apparatus as claimed in claim 4, wherein said gaseous raw material is obtained by evaporating liquid raw material of optical fiber by heating said liquid raw material so that a pressure of gaseous raw material is higher than atmospheric pressure, said gaseous raw material being introduced into said burner by said pressure, said liquid raw material including $SiCl_4$ and $GeCl_4$ held in liquid state at room temperature.

21. A gas reaction apparatus as claimed in claim 5, wherein said gaseous raw material is obtained by evaporating liquid raw material of optical fiber by heating said liquid raw material so that a pressure of gaseous raw material is higher than atmospheric pressure, said gaseous raw material being introduced into said burner by said pressure, said liquid raw material including $SiCl_4$ and $GeCl_4$ held in liquid state at room temperature.

22. A burner as claimed in claim 6, wherein said gaseous raw material is obtained by evaporating liquid raw material of optical fiber by heating said liquid raw material so that a pressure of gaseous raw material is higher than atmospheric pressure, said gaseous raw material being introduced into said burner by said pressure, said liquid raw material including $SiCl_4$ and $GeCl_4$ held in liquid state at room temperature.

23. A burner as claimed in claim 7, wherein said gaseous raw material is obtained by evaporating liquid raw material of optical fiber by heating said liquid raw material so that a pressure of gaseous raw material is higher than atmospheric pressure, said gaseous raw material being introduced into said burner by said pressure, said liquid raw material including $SiCl_4$ and $GeCl_4$ held in liquid state at room temperature.

24. A burner as claimed in claim 8, wherein said gaseous raw material is obtained by evaporating liquid raw material of optical fiber by heating said liquid raw material so that s pressure of gaseous raw material is higher than atmospheric pressure, said gaseous raw material being introduced into said burner by said pressure, said liquid raw material including $SiCl_4$ and $GeCl_4$ held in liquid state at room temperature.

* * * * *